(12) United States Patent
Sumi et al.

(10) Patent No.: US 11,621,174 B2
(45) Date of Patent: Apr. 4, 2023

(54) SUBSTRATE PROCESSING APPARATUS

(71) Applicant: SCREEN Holdings Co., Ltd., Kyoto (JP)

(72) Inventors: Noritake Sumi, Kyoto (JP); Masanobu Sato, Kyoto (JP); Masayuki Orisaka, Kyoto (JP); Daiki Uehara, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 145 days.

(21) Appl. No.: 16/910,000

(22) Filed: Jun. 23, 2020

(65) Prior Publication Data

US 2020/0411334 A1    Dec. 31, 2020

(30) Foreign Application Priority Data

Jun. 28, 2019    (JP) .............................. JP2019-121644

(51) Int. Cl.
*H01L 21/67* (2006.01)
*B08B 5/00* (2006.01)
*B08B 3/08* (2006.01)
*B08B 7/00* (2006.01)

(52) U.S. Cl.
CPC ............ *H01L 21/6704* (2013.01); *B08B 3/08* (2013.01); *B08B 5/00* (2013.01); *B08B 7/0021* (2013.01); *H01L 21/67017* (2013.01)

(58) Field of Classification Search
CPC . H01L 21/6704; H01L 21/67017; B08B 3/08; B08B 5/00; B08B 7/0021
USPC ........................................................ 134/200
See application file for complete search history.

(56) References Cited

U.S. PATENT DOCUMENTS

| | | |
|---|---|---|
| 8,465,596 B2 | 6/2013 | Toshima et al. |
| 9,004,086 B2 | 4/2015 | Nixon et al. |
| 9,027,576 B2 | 5/2015 | Cho et al. |
| 9,534,839 B2 | 1/2017 | Lee et al. |
| 9,984,902 B2 | 5/2018 | Kim et al. |
| 10,361,100 B2 | 7/2019 | Lee et al. |
| 10,395,950 B2 | 8/2019 | Goshi et al. |
| 10,796,897 B2 | 10/2020 | Kiyohara |
| 2013/0145640 A1 | 6/2013 | Lee et al. |

(Continued)

FOREIGN PATENT DOCUMENTS

| | | |
|---|---|---|
| JP | 2006222468 | 8/2006 |
| JP | 2010177551 | 8/2010 |

(Continued)

*Primary Examiner* — Tinsae B Ayalew
(74) *Attorney, Agent, or Firm* — JCIPRNET

(57) ABSTRACT

The disclosure provides a substrate processing apparatus that processes a surface of a substrate with a processing fluid in a supercritical state, in which the substrate is protected from the pressure fluctuation caused by partial vaporization of the processing fluid in the flow path. A substrate processing apparatus which processes a surface of a substrate with a processing fluid in a supercritical state includes a chamber housing provided therein with a processing space capable of housing the substrate and a flow path which receives the processing fluid from outside and guides the processing fluid to the processing space, and a fluid supply part which pressure-feeds the processing fluid to the flow path, wherein a plurality of bent parts which change a flow direction of the processing fluid are provided in the flow path.

20 Claims, 5 Drawing Sheets

(56) References Cited

U.S. PATENT DOCUMENTS

2018/0102263 A1    4/2018  Kim et al.
2018/0138060 A1*   5/2018  Okamura ............ H01L 21/6719
2021/0111042 A1    4/2021  Kim et al.

FOREIGN PATENT DOCUMENTS

| | | |
|---|---|---|
| JP | 2013033962 | 2/2013 |
| JP | 2013120944 | 6/2013 |
| JP | 2013201334 | 10/2013 |
| JP | 2014067955 | 4/2014 |
| JP | 2014175669 | 9/2014 |
| JP | 2018082043 | 5/2018 |
| JP | 2018093110 | 6/2018 |
| JP | 2019033246 | 2/2019 |
| KR | 20110139461 | 12/2011 |
| KR | 20130014312 | 2/2013 |
| KR | 20140071947 | 6/2014 |
| KR | 20180050236 | 5/2018 |
| TW | I467646 | 1/2015 |
| TW | I592997 | 7/2017 |

* cited by examiner

SUBSTRATE PROCESSING APPARATUS

CROSS REFERENCE TO RELATED APPLICATION

The disclosure of Japanese Patent Application No. 2019-121644 filed on Jun. 28, 2019 including specification, drawings and claims is incorporated herein by reference in its entirety.

BACKGROUND

1. Technical Field

The disclosure relates to a substrate processing apparatus that processes a surface of a substrate with a processing fluid in a supercritical state.

2. Description of the Related Art

The process of processing various substrates such as a semiconductor substrate and a glass substrate for a display apparatus includes processing the surface of the substrate with various processing fluids. Although processing using liquids such as chemicals and rinses as the processing fluids has been widely performed in the past, processing using supercritical fluids has been put into practical use in recent years. In particular, in the processing of a substrate having a fine pattern formed on its surface, a supercritical fluid having a lower surface tension than a liquid penetrates deep into gaps among the pattern, whereby the processing may be performed efficiently. In addition, the risk of pattern collapse caused by the surface tension during drying may be reduced.

For example, Japanese Laid-open Publication No. 2018-082043 (Patent Document 1) describes a substrate processing apparatus that performs drying processing on a substrate using a supercritical fluid. In this apparatus, two plate-shaped members are disposed to face each other, and the gap therebetween serves as a processing space. Then, the wafer (substrate) placed on a thin plate-shaped holding plate is carried in from one end part of the processing space, and carbon dioxide in the supercritical state is introduced from the other end part.

Supplying the processing fluid in the supercritical state to the processing space may not always be the best in terms of practicality because a predetermined temperature and pressure environment must be maintained throughout the supply path. In actual processing, a processing fluid in a gas state or a liquid state is introduced into a processing chamber to create a predetermined temperature and pressure environment within the processing chamber. By doing so, the inside of the processing chamber is filled with the processing fluid in the supercritical state.

Particularly in the case where the processing fluid is pressure-fed in a liquid state, a part of the liquid may vaporize due to, for example, the fluctuation in the pressure loss in the flow path. As a result, the fluid expands abruptly, and the pressure in the flow path may fluctuate significantly. When such a pressure fluctuation is transmitted to the substrate in the processing space, the substrate is damaged. In particular, in a substrate having a fine pattern, serious damage such as pattern collapse may occur. However, this point is not taken into consideration in the above conventional technique.

The disclosure has been made in view of the above problems, and the disclosure provides a technique of a substrate processing apparatus that processes a surface of a substrate with a processing fluid in a supercritical state, in which the substrate is protected from the pressure fluctuation caused by partial vaporization of the processing fluid in the flow path.

SUMMARY

An aspect of the disclosure provides a substrate processing apparatus which processes a surface of a substrate with a processing fluid in a supercritical state, and the substrate processing apparatus includes a chamber housing provided therein with a processing space capable of housing the substrate and a flow path which receives the processing fluid from outside and guides the processing fluid to the processing space, and a fluid supply part which pressure-feeds the processing fluid to the flow path, wherein a plurality of bent parts which change a flow direction of the processing fluid are provided in the flow path.

In the disclosure configured in this way, a plurality of bent parts are provided in the flow path before the processing fluid supplied into the chamber housing reaches the processing space. The pressure loss in the bent parts is larger than that in other parts of the flow path, so vaporization of the processing fluid is likely to occur here. In a flow path having a plurality of bent parts, vaporization is more likely to occur in the bent part on the upstream side in the flow direction of the processing fluid. Therefore, by providing a plurality of bent parts in the flow path, the probability of vaporization occurring further downstream may be reduced. Further, even when the pressure fluctuation caused by the vaporization and expansion occurs on the upstream side, since there is a bent part with a high pressure loss in the flow path on the downstream side, the pressure fluctuation is suppressed from being propagated further to the downstream side. As a result, the influence of the pressure fluctuation may be suppressed from reaching the substrate, and damage to the substrate may be avoided.

DESCRIPTION OF THE EMBODIMENTS

Figure 1:
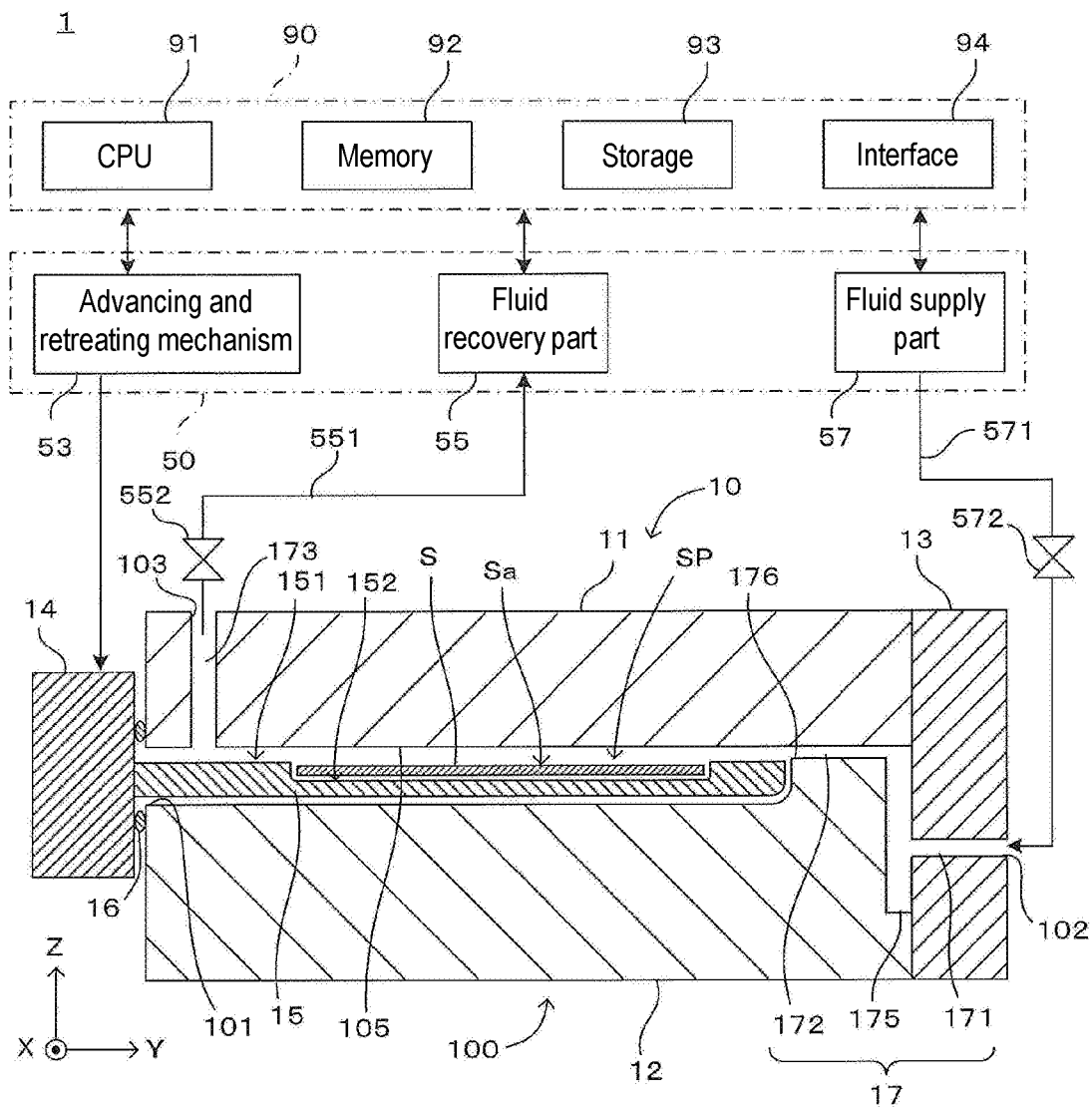
FIG. 1 is a view showing a schematic configuration of an embodiment of a substrate processing apparatus according to the disclosure.

As described above, in the disclosure, a plurality of bent parts having a large pressure loss are disposed in the flow path of the processing fluid introduced into the chamber housing and reaching the processing space. As a result, vaporization of the processing fluid that is sent through the flow path in an easily vaporized state may be caused at an early stage, and the pressure fluctuation caused by the vaporization may be suppressed from reaching the substrate. In this way, the substrate is protected from the pressure fluctuation caused by the partial vaporization of the processing fluid within the flow path.

The above and further objects and novel features of the disclosure will more fully appear from the following detailed description when the same is read in connection with the accompanying drawing. It is to be expressly understood, however, that the drawing is for purpose of illustration only and is not intended as a definition of the limits of the disclosure.

FIG. 1 is a view showing a schematic configuration of an embodiment of a substrate processing apparatus according to the disclosure. This substrate processing apparatus 1 is an apparatus for processing surfaces of various substrates such as semiconductor substrates using a supercritical fluid. An XYZ orthogonal coordinate system is set as shown in FIG. 1 in order to uniformly indicate the directions in the following drawings. Here, the XY plane is a horizontal plane, and the Z direction represents the vertical direction. More specifically, the (−Z) direction represents the vertically downward direction.

Here, various substrates such as a semiconductor wafer, a photomask glass substrate, a liquid crystal display glass substrate, a plasma display glass substrate, a field emission display (FED) substrate, an optical disc substrate, a magnetic disc substrate, a magneto-optical disk substrate and the like may be applied as the "substrate" in the embodiment. In the following, a substrate processing apparatus mainly used for processing semiconductor wafers will be described as an example with reference to the drawings, but the same may be applied to the processing of the various substrates exemplified above.

The substrate processing apparatus 1 includes a processing unit 10, a supply unit 50 and a control unit 90. The processing unit 10 is a main body for executing supercritical drying processing. The supply unit 50 supplies chemical substances and power required for the processing to the processing unit 10.

The control unit 90 controls each part of the apparatus to realize predetermined processing. For this purpose, the control unit 90 includes a CPU 91 for executing various control programs, a memory 92 for temporarily storing processing data, a storage 93 for storing control programs to be executed by the CPU 91, and an interface 94 for exchanging information with users and external apparatuses. Operations of the apparatus to be described later are realized by the CPU 91 executing the control programs written in advance in the storage 93 and causing each part of the apparatus to perform a predetermined operation.

The processing unit 10 includes a processing chamber 100. The processing chamber 100 has a structure in which a plurality of metal blocks 11, 12 and 13 are combined, and their insides form a cavity 105. The internal space of the cavity 105 serves as a processing space SP in which processing on a substrate S is executed. The substrate S to be processed is carried into the processing space SP to undergo processing. A slit-shaped opening 101 which is elongated and extends in the X direction is formed on the side surface of the processing chamber 100 on the (−Y) side, and the processing space SP and the external space communicate with each other through the opening 101.

A lid member 14 is provided on the side surface of the processing chamber 100 on the (−Y) side to close the opening 101. A flat plate-shaped support tray 15 is attached in a horizontal posture to the side surface of the lid member 14 on the (+Y) side, and the upper surface of the support tray 15 is a support surface on which the substrate S may be placed. More specifically, the support tray 15 is provided with a recess 152 which is formed on a substantially flat upper surface 151 and which is slightly larger than the planar size of the substrate S. By housing the substrate S in the recess 152, the substrate S is held at a predetermined position on the support tray 15. The substrate S is held with a surface to be processed (hereinafter simply referred to as the "substrate surface") Sa facing upward.

The lid member 14 is supported by a support mechanism (not shown) to be horizontally movable in the Y direction. Further, the lid member 14 may be moved to advance and retreat in the Y direction with respect to the processing chamber 100 by an advancing and retreating mechanism 53 provided in the supply unit 50. Specifically, the advancing and retreating mechanism 53 has a linear motion mechanism, such as a linear motor, a linear motion guide, a ball screw mechanism, a solenoid and an air cylinder, and such a linear motion mechanism moves the lid member 14 in the Y direction. The advancing and retreating mechanism 53 operates in response to a control command from the control unit 90.

By moving the lid member 14 in the (−Y) direction, the support tray 15 is pulled out from the processing space SP through the opening 101. Then, the support tray 15 may be accessed from the outside. That is, the substrate S may be placed on the support tray 15, and the substrate S placed on the support tray 15 may be taken out. On the other hand, by moving the lid member 14 in the (+Y) direction, the support tray 15 is housed in the processing space SP. When the substrate S is placed on the support tray 15, the substrate S is carried into the processing space SP together with the support tray 15.

In supercritical drying processing which may prevent the pattern collapse caused by the surface tension of the liquid, the substrate S is carried in with the surface Sa covered with a liquid film in order to prevent the surface Sa from being exposed and the pattern collapse from occurring. An organic solvent having a relatively low surface tension such as isopropyl alcohol (IPA) or acetone may be suitably used as a liquid forming the liquid film.

By moving the lid member 14 in the (+Y) direction and closing the opening 101, the processing space SP is sealed. A seal member 16 is provided between the side surface of the lid member 14 on the (+Y) side and the side surface of the processing chamber 100 on the (−Y) side to maintain the airtight state of the processing space SP. Further, the lid member 14 is fixed to the processing chamber 100 by a lock mechanism (not shown). In this way, the processing is executed on the substrate S in the processing space SP while the airtight state of the processing space SP is ensured.

In this embodiment, a fluid supply part 57 provided in the supply unit 50 supplies a fluid of a substance that may be used for supercritical processing, such as carbon dioxide, to the processing unit 10 in a gas state or a liquid state. Carbon dioxide is in a supercritical state at a relatively low temperature and low pressure, and has a property of well dissolving an organic solvent often used for substrate processing. In this respect, carbon dioxide is a suitable chemical substance for the supercritical drying processing.

More specifically, the fluid supply part 57 outputs a fluid in a supercritical state or a fluid which is supplied in a gas state or a liquid state and is subsequently put into a supercritical state when given a predetermined temperature and pressure as a processing fluid for processing the substrate S. For example, carbon dioxide in a gas state or a liquid state is output in a pressurized state. The fluid is pressure-fed to an input port 102 provided on the side surface of the processing chamber 100 on the (+Y) side through a pipe 571 and an opening and closing valve 572 inserted in the middle of the pipe 571. That is, the opening and closing valve 572 is opened in response to the control command from the control unit 90, whereby the fluid is sent from the fluid supply part 57 to the processing chamber 100.

A flow path 17 of the fluid from the input port 102 to the processing space SP has a first flow path 171, a buffer part 175, and a second flow path 172. The first flow path 171 is a flow path having a constant cross-sectional area and guides the fluid pressure-fed from the fluid supply part 57 to the input port 102 to the buffer part 175. The buffer part 175 is a space formed so that the flow path cross-sectional area is abruptly increased as compared with the first flow path 171.

Even in the case where the fluid is supplied as a liquid, it may vaporize and expand in the flow path due to the fluctuation in pressure loss in the flow path and the like. If such abrupt expansion occurs near the substrate S, the substrate S may be damaged. In order to avoid this, a part in which the pressure loss fluctuates greatly is provided in a part of the flow path 17 that reaches the processing space SP, and possible vaporization and expansion occur in this part. The buffer part 175 is provided as a space for this. Further, the buffer part 175 also has a rectifying function for allowing the fluid flowing through the first flow path 171 in a tubular shape to be supplied in a thin layer shape to the processing space SP as described later.

The second flow path 172 guides the fluid from the buffer part 175 to the processing space SP. Specifically, the second flow path 172 is a flow path that connects the internal space of the buffer part 175 and the processing space SP, and the flow path cross-sectional area thereof is smaller than that of the buffer part 175. The second flow path 172 has a flat, horizontally long cross-sectional shape that is narrow in the vertical direction (the Z direction) and wide in the horizontal direction (the X direction). When the fluid passes through the second flow path 172, a flow in a thin layer shape is formed.

The (-Y) side end part of the second flow path 172 opens toward the processing space SP to form a discharge port 176. More specifically, the discharge port 176 is opened on the side wall surface of the cavity 105 on the (+Y) side, and the second flow path 172 communicates with the processing space SP through the discharge port 176. The opening shape and the opening size of the discharge port 176 are identical to the opening shape and the opening size of the second flow path 172. Further, the opening position of the discharge port 176 is provided on the extension line of the second flow path 172. Therefore, the fluid flowing in a thin layer shape in the second flow path 172 is discharged to the processing space SP while maintaining its shape and flow rate.

The fluid supplied through the flow path 17 is filled in the processing space SP, and when the inside of the processing space SP reaches an appropriate temperature and pressure, the fluid enters a supercritical state. In this way, the substrate S is processed by the supercritical fluid in the processing chamber 100. The supply unit 50 is provided with a fluid recovery part 55, and the fluid after the processing is recovered by the fluid recovery part 55. The fluid supply part 57 and the fluid recovery part 55 are controlled by the control unit 90.

More specifically, an output port 103 communicating with the processing space SP is provided above the processing chamber 100. The output port 103 is connected to the fluid recovery part 55 through a pipe 551 and an opening and closing valve 552 inserted in the middle of the pipe 551. The opening and closing valve 552 is opened in response to the control command from the control unit 90, whereby the fluid in the processing space SP is sent to the fluid recovery part 55 and recovered. A flow path from the processing space SP to the output port 103 is provided further on the (-Y) side than the end part of the substrate S in the (-Y) direction. Hereinafter, this flow path is referred to as a "third flow path" and is denoted by the reference numeral 173.

Figure 2:
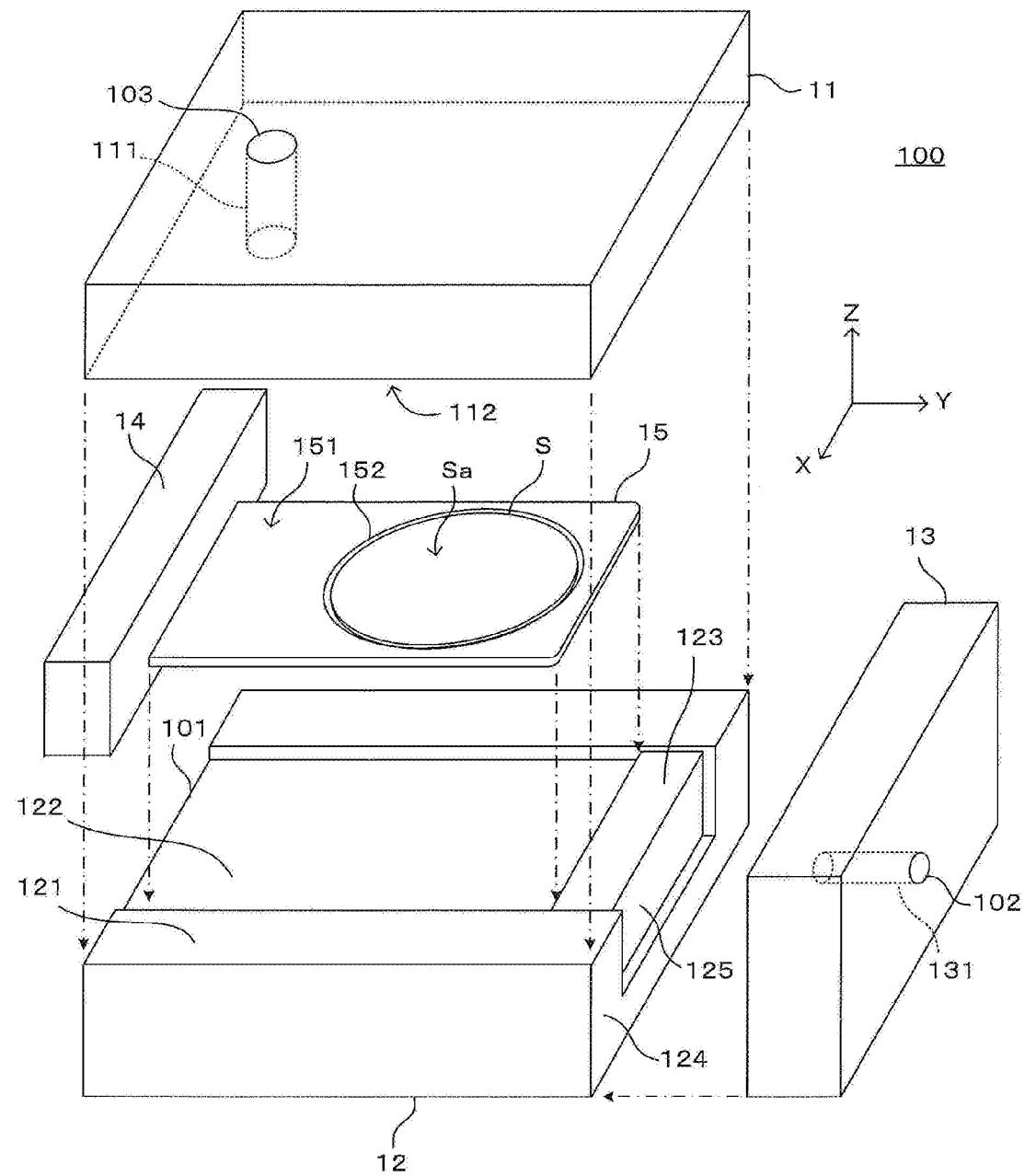
FIG. 2 is an exploded view showing a structure of the processing chamber.

FIG. 2 is an exploded view showing a structure of the processing chamber. The processing chamber 100 includes a first member 11, a second member 12 and a third member 13 each formed by a metal block. The first member 11 and the second member 12 are combined in the vertical direction by a combining member (not shown), and the side surfaces of the first member 11 and the second member 12 on the (+Y) side are combined to the third member 13 by a combining member (not shown) to form the processing chamber 100.

The first member 11 is a thick plate-shaped member whose main surfaces are surfaces parallel to the XY plane and is provided with a through hole 111 penetrating between the two main surfaces in the vertical direction. The through hole 111 forms the third flow path 173 and the output port 103. Further, as described later, a lower surface 112 of the first member 11 functions as the ceiling surface of the cavity 105 that surrounds the processing space SP. Further, the third member 13 is a thick plate-shaped member whose main surfaces are surfaces parallel to the XZ plane and is provided with a through hole 131 penetrating between the two main surfaces in the Y direction. The through hole 131 forms the first flow path 171 and the input port 102.

The second member 12 has a more complicated shape in order to form the flow path 17 of the fluid as described above. That is, an upper surface 121 of the second member 12 is a substantially flat contact surface and contacts the lower surface 112 of the first member 11, whereby the processing space SP and the flow path 17 are formed in the gap between the two. More specifically, the central part of the upper surface 121 is provided with a concave part 122 whose upper part is closed by the first member 11 to form the processing space SP. The concave part 122 is formed to correspond to the shape of the support tray 15. Specifically, the shape of the concave part 122 in a plan view is substantially similar to the shape of the support tray 15, and the planar size thereof is slightly larger than the planar size of the support tray 15. Further, the depth of the concave part 122 is slightly larger than the thickness of the support tray 15.

The concave part 122 extends to the end part of the second member 12 on the (-Y) side with a constant depth. Since the upper part of the concave part 122 is closed by the first member 11, the end part of the concave part 122 on the (-Y) side functions as the opening 101 for putting in and taking out the support tray 15.

A step part 123 having a depth from the upper surface 121 smaller than that of the concave part 122 is provided adjacent to the end part of the concave part 122 on the (+Y) side. The gap between the first member 11 and the second member 12, which is formed by closing the upper part of the step part 123 by the first member 11, forms the second flow path 172. Further, the boundary part between the concave part 122 and the step part 123 forms the discharge port 176.

A side surface 124 of the second member 12 on the (+Y) side is provided with a concave part 125 whose surface recedes to the (-Y) side from the side surface 124. The upper side of the concave part 125 is closed by the first member 11 and the (+Y) side thereof is closed by the third member 13 to form a surrounded space, and this space serves as the buffer part 175. The through hole 131 of the third member 13 is provided at a position facing the buffer part 175 formed in this way and functions as the first flow path 171.

Figure 3A:
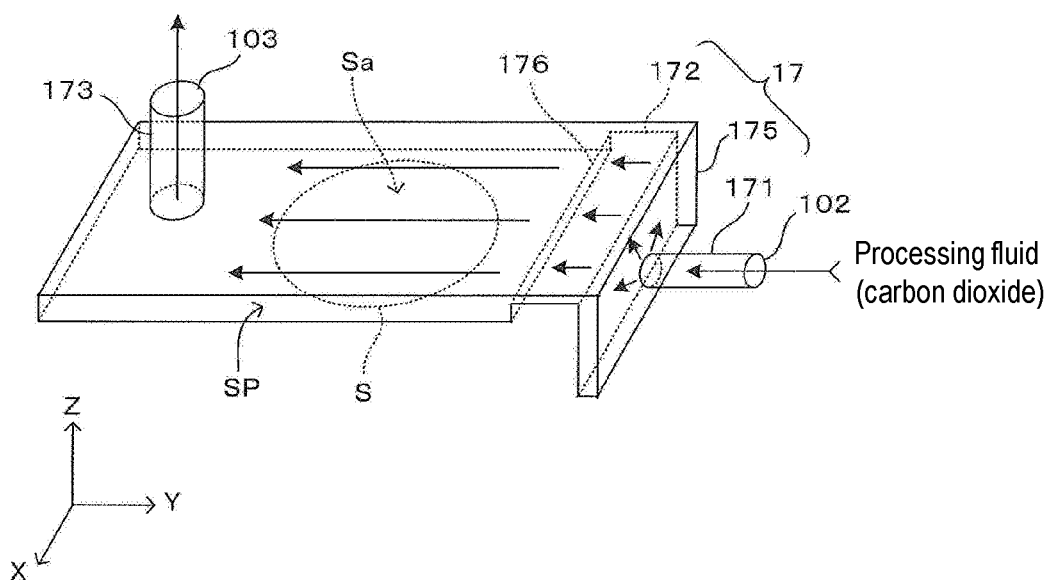
FIG. 3A is a first view showing the flow path of the fluid.
Figure 3B:
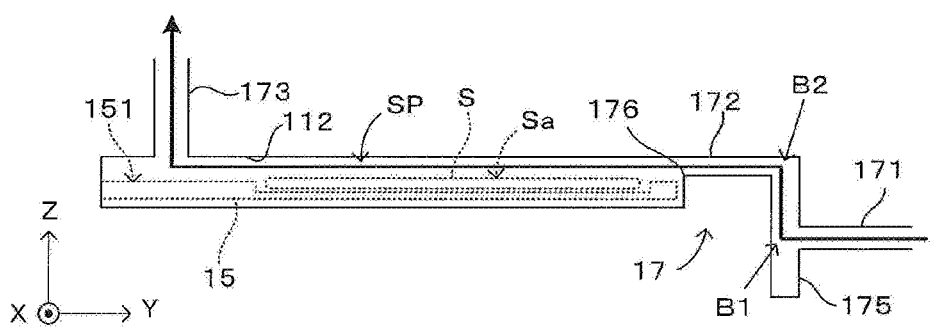
FIG. 3B is a second view showing the flow path of the fluid.

FIGS. 3A and 3B are views showing the flow path of the fluid. More specifically, these are views schematically showing the shape of the flow path of the fluid formed in the processing chamber 100 having the above structure, and FIG. 3A is a perspective view, and FIG. 3B is a side view. In the figures, arrows indicate the flow direction of the fluid. The processing fluid (such as carbon dioxide in a gas state or a liquid state) pressure-fed from the fluid supply part 57 flows through the flow path 17 and the processing space SP in the processing chamber 100, and finally passes through the third flow path 173 and is discharged from the output port 103 to the outside of the chamber.

The fluid flowing from the input port 102 into the first flow path 171 flows in the first flow path 171 in the (−Y) direction and then flows into the buffer part 175. In the buffer part 175, the fluid spreads in the surfaces parallel to the XZ plane and flows into the second flow path 172 at the upper part of the buffer part 175. The fluid becomes a thin layer in the second flow path 172 and is discharged from the discharge port 176 into the processing space SP. In order to form a flow uniform in the width direction in the processing space SP, it is preferable that the second flow path 172, the discharge port 176, and the processing space SP have the same width, that is, have the same size in the X direction.

Here, as may be seen from FIG. 1 and FIG. 3B, the flow directions of the fluid in the first flow path 171 and the second flow path 172 provided with the buffer part 175 sandwiched therebetween are both the (−Y) direction. However, these flow paths are disposed at different positions in the Z direction. In other words, the opening positions of the first flow path 171 and the second flow path 172 that respectively open toward the buffer part 175 do not overlap with each other in the Z direction. Specifically, the first flow path 171 is connected to a substantially central part of the buffer part 175 in the vertical direction in a side view. On the other hand, the second flow path 172 is connected to the upper end part of the buffer part 175.

In this way, the flow direction of the fluid in the flow path 17 is as follows. That is, the fluid that has advanced in the (−Y) direction through the first flow path 171 advances upward in the buffer part 175, that is, in the (+Z) direction, and flows again in the (−Y) direction when flowing into the second flow path 172. Therefore, the fluid flowing into the first flow path 171 changes its flow direction for a plurality of times before being discharged into the processing space SP through the buffer part 175.

Specifically, as shown in FIG. 3B, the flow path 17 includes a bent part B1, in which the flow path is bent 90 degrees between the first flow path 171 and the buffer part 175, and a bent part B2, in which the flow path is bent 90 degrees between the buffer part 175 and the second flow path 172. Of the bent parts, the bent part B2 is the most downstream bent part in the flow path 17 from the input port 102 to the processing space SP. In these bent parts B1 and B2, the flow direction of the processing fluid changes by 90 degrees. The reason for such a structure is as follows.

As described above, when the fluid is supplied in a liquid state, it may vaporize in the flow path 17, particularly in the buffer part 175, and expand abruptly. At this time, the impact caused by the abrupt expansion may adversely influence the substrate S in the processing space SP. In particular, if the flow path from the first flow path 171 to the second flow path 172 is in a straight line, in other words, if the first flow path 171 may be seen from the discharge port 176 through the second flow path 172, there is a risk that the impact caused by the expansion of the fluid that has flowed from the first flow path 171 into the buffer part 175 may directly reach the processing space SP through the second flow path 172.

In the embodiment, the first flow path 171 and the second flow path 172 are disposed at different positions in the Z direction; in other words, it is a structure in which the first flow path 171 may not be seen from the discharge port 176. In this way, the impact caused by the abrupt expansion of the fluid near the outlet of the first flow path 171 may be prevented from immediately reaching the processing space SP. As described above, the structure of the flow path 17 in the embodiment has a function of suppressing the impact caused by the abrupt expansion of the liquid from being propagated to the processing space SP and preventing the damage of the substrate S caused by the impact. In order to reliably prevent the propagation of the impact, the magnitude of change in the flow direction of the fluid is preferably 90 degrees or more.

In the processing space SP, the fluid passes through the gap between the lower surface 112 of the first member 11, which is the ceiling surface of the processing space SP, and the support tray 15 and the substrate S housed in the processing space SP. The upper surface 151 of the support tray 15, the upper surface (surface) Sa of the substrate S, and the ceiling surface 112 of the processing space SP are all flat surfaces. Therefore, the fluid passes through the gap space formed by these surfaces facing one another. As described below, this embodiment is configured to form a laminar flow in which the fluid discharged from the discharge port 176 flows along the upper surface Sa of the substrate S.

The following effects are obtained by making the flow of the processing fluid along the substrate surface Sa be a laminar flow. For example, in the case where a fine pattern is formed on the substrate surface Sa, a part of the processing fluid flowing as a laminar flow enters gaps among the pattern to facilitate stirring in the pattern. As a result, the processing fluid and the deposits remaining in the deep part of the pattern are scraped out to the surface, whereby the efficiency of the processing of removing these residues from the substrate surface Sa may be improved.

Further, since the residues released from the substrate surface Sa are carried in one direction, in the (−Y) direction in this example, by the laminar flow, they are prevented from staying on the periphery of the substrate surface Sa and redepositing. As described above, flowing the processing fluid as a laminar flow along the substrate surface Sa has great significance in improving the processing efficiency and processing the substrate well.

FIGS. 4A to 4D are views showing various examples of the shape of the flow path. More specifically, these are views showing various shapes of the flow path from the input port to the processing space. In addition, these figures show the state where the input port is on the left side surface of the processing chamber, contrary to FIG. 1 and the like. In the example shown in FIG. 4A, an input port 211 and a processing space 219 provided in a chamber housing 210 are connected by a flow path 212. The flow path 212 has a constant cross-sectional area and has two bent parts 213 and 214. With such a configuration, even if the processing fluid expands in the bent part 213 on the upstream side, since the pressure fluctuation caused by the expansion is transmitted to the downstream side through the bent part 214, the influence on the processing space 219 is reduced.

Figure 4A:
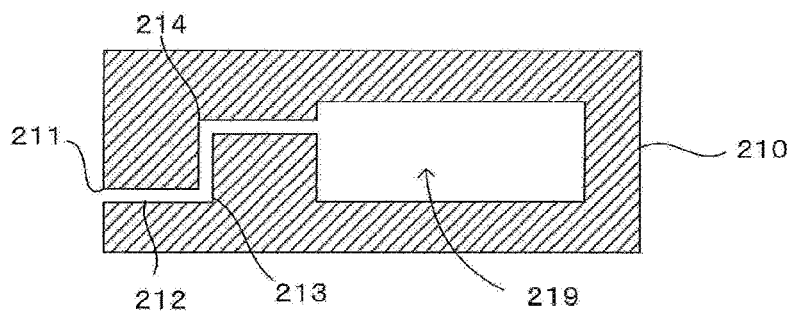
FIG. 4A is a first view showing an example of the shape of the flow path.
Figure 4B:
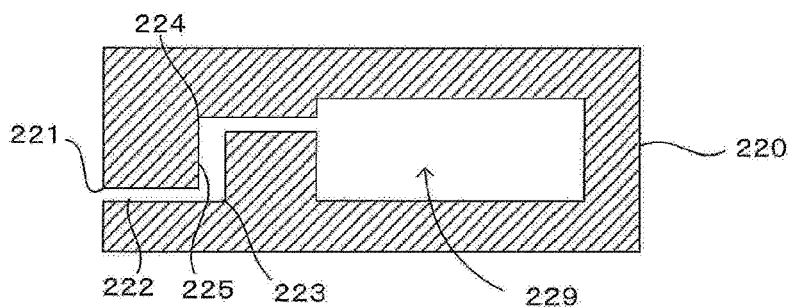
FIG. 4B is a second view showing an example of the shape of the flow path.

In the example shown in FIG. 4B, an input port 221 and a processing space 229 provided in a chamber housing 220 are connected by a flow path 222. The flow path 222 is provided with two bent parts 223 and 224. Here, the flow path cross-sectional area of a flow path 225 between the bent parts 223 and 224 is larger than that of the parts before and after it. Therefore, vaporization of the processing fluid is likely to occur at the bent part 223 where the flow path cross-sectional area changes. Further, the volume change caused by the vaporization and expansion of the processing fluid that has passed through the bent part 223 may be absorbed to some extent by the flow path 225 having a large cross-sectional area.

Figure 4C:
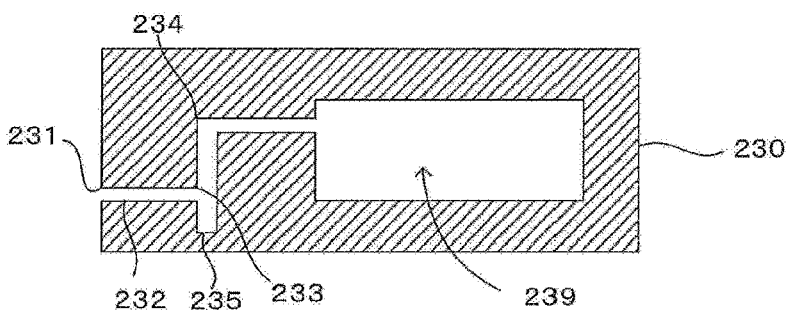
FIG. 4C is a third view showing an example of the shape of the flow path.

In the example shown in FIG. 4C, an input port 231 and a processing space 239 provided in a chamber housing 230 are connected by a flow path 232. The flow path 232 is provided with two bent parts 233 and 234. Further, a protruding part 235 having a flow path protruding on the side opposite to the flow direction of the processing fluid is provided adjacent to the bent part 233. With such a shape as well, the volume change caused by the vaporization and expansion of the processing fluid may be absorbed. The shape of the flow path 17 shown in FIG. 1 corresponds to this case.

Figure 4D:
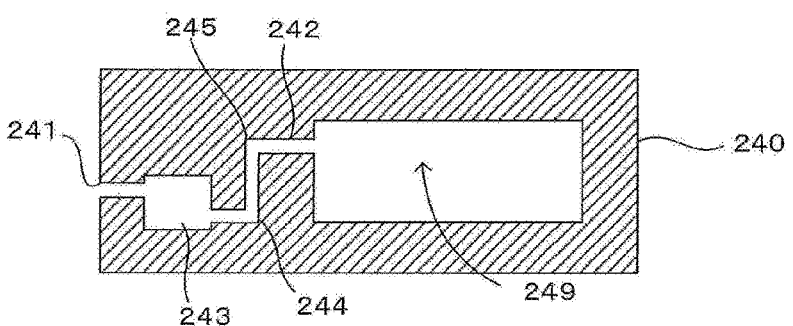
FIG. 4D is a fourth view showing an example of the shape of the flow path.

In the example shown in FIG. 4D, an input port 241 and a processing space 249 provided in a chamber housing 240 are connected by a flow path 242. The flow path 242 is provided with a buffer part 243 whose flow path cross-sectional area is abruptly increased, and two bent parts 244 and 245 are provided on the downstream side thereof. With such a shape, when the processing fluid expands in the buffer part 243, the pressure fluctuation is transmitted to the processing space 249 through the two bent parts 244 and 245. Therefore, the influence of the pressure fluctuation is small in the processing space 249. An example of the shape of the flow path described below is a more specific form of the shape shown in FIG. 4D.

Figure 5:
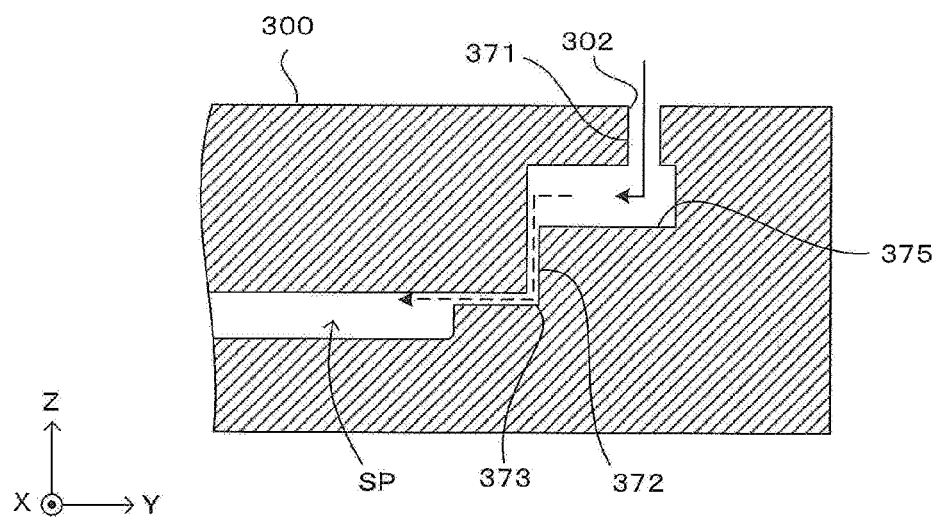
FIG. 5 is a view showing a modified example of the processing chamber.

FIG. 5 is a view showing a modified example of the processing chamber. More specifically, FIG. 5 is a view showing a modified example of the shape of the flow path of the processing fluid from the input port to the processing space in the processing chamber of the substrate processing apparatus 1 shown in FIG. 1. In a processing chamber 300 of this modified example, an input port 302 for receiving the processing fluid is provided in the upper part of the chamber housing, and a buffer part 375 is provided inside the housing below the input port 302. As indicated by the solid line arrow, the flow direction of the processing fluid flowing from the input port 302 through a first flow path 371 is bent 90 degrees at the stage of advancing from the first flow path 371 to the buffer part 375.

The buffer part 375 and the processing space SP are connected by a second flow path 372. The second flow path 372 is a flow path having a constant cross-sectional area, communicates with an opening provided near the end part on the (−Y) side of the bottom part of the buffer part 375, and has a bent part 373 bending 90 degrees in the middle of the flow path. Therefore, as indicated by the broken line arrow, the flow direction of the processing fluid changes at the stage of advancing from the buffer part 375 to the second flow path 372, and the flow direction further changes in the middle of the second flow path 372 before reaching the processing space SP.

As described above, in this modified example, the processing fluid flows through the bent parts twice, one time in the flow path from the first flow path 371 to the buffer part 375, and the other time in the flow path from the buffer part 375 to the processing space SP through the second flow path 372. Therefore, even if vaporization of the processing fluid occurs at the stage of flowing into the buffer part 375 from the first flow path 371, the probability for the pressure fluctuation and impact caused by the vaporization to reach the processing space SP is low. Therefore, damage to the substrate S stored in the processing space SP may be prevented.

As described above, the substrate processing apparatus 1 of this embodiment is a apparatus for processing the substrate S housed in the processing space SP using the processing fluid in the supercritical state. In this apparatus, a plurality of bent parts are provided in the flow path 17 from the input port 102 that receives the processing fluid from the outside to the processing space SP, in which the flow direction of the processing fluid changes and thus the pressure loss of the flow path changes. Therefore, while the processing fluid is likely to vaporize and expand in the upstream part of the flow path, the pressure fluctuation caused by the vaporization and expansion is unlikely to be transmitted to the downstream processing space SP. Therefore, the expansion of the processing fluid in the processing space SP may be prevented, and the substrate S may be protected from the damage caused by an abrupt pressure fluctuation.

As described above, in this embodiment, the processing chamber 10 mainly formed by the first to third members 11 to 13 functions as the "chamber housing" of the disclosure. Further, the bent parts B1, B2, 213, 214 and the like provided in the flow path 17 correspond to the "bent parts" of the disclosure. Further, the first flow path 171 and the second flow path 172 function as the "input flow path" and the "output flow path" of the disclosure, respectively.

Further, the internal space of the buffer part 175 and the like corresponds to the "buffer space" of the disclosure. Further, the pipe 571 and the opening and closing valve 572 that connect the fluid supply part 57 and the input port 102 correspond to the "pipe" and the "valve" of the disclosure, respectively.

In addition, the disclosure is not limited to the above-described embodiments, and various modifications other than those described above may be made without departing from the spirit of the disclosure. For example, in the substrate processing apparatus 1 of the above embodiments, the inside of the cavity 105 corresponding to the outer shape of the support tray 15 that supports the substrate S is the processing space SP, and the processing fluid is supplied from the side of the substrate S. However, as described above, the configuration in which the plurality of bent parts are provided in the flow path guiding the processing fluid to the processing space SP may be applied to, for example, types of processing apparatuses that supply the processing fluid from above or below the substrate S.

Further, various chemical substances used in the processing of the above embodiments are only some examples, and various things may be used instead of the above chemical substances as long as they are in accordance with the technical idea of the disclosure.

As described above by exemplifying with the specific embodiments, in the substrate processing apparatus according to the disclosure, it may be configured that the flow path is provided with a buffer space in which a flow path cross-sectional area is increased when viewed from an upstream side in the flow direction and provided with at least one of the bent parts further on a downstream side in the flow direction than the buffer space, that the flow path has an output flow path which connects the bent part which is most downstream in the flow direction to the processing space, that the flow direction of the processing fluid changes between the buffer space and the output flow path, that the output flow path has a cross-sectional shape which is flat in a longitudinal direction being a direction parallel to the surface of the substrate and which is constant in the flow direction, and that the output flow path is connected to the processing space through a discharge port which opens in a slit shape extending in the longitudinal direction and toward the processing space.

According to such a configuration, the vaporization and expansion of the processing fluid are likely to occur in the buffer space where the flow path cross-sectional area increases, and the volume change caused by the vaporization and expansion may be absorbed to some extent in the buffer space. Further, the propagation of the pressure fluctuation caused by the expansion is suppressed by the bent part on the downstream side. Then, the processing fluid is sent from the output flow path having a flat and constant cross-sectional shape in the direction parallel to the surface of the substrate through the slit-shaped discharge port, whereby the processing fluid may be supplied to the substrate in a laminar flow with less turbulence. In this case, by changing the flow direction of the processing fluid at the connection part between the buffer space and the output flow path, this part may function as the most downstream bent part.

Further, by making the cross-sectional shape of the output flow path constant, the pressure loss of the flow path between the most downstream bent part and the processing space is constant, so the probability of the vaporization and expansion of the processing fluid at this part may be kept low. As a result, the damage to the substrate caused by the pressure fluctuation occurring at a position close to the substrate may be suppressed.

Here, for example, a size of an opening of the discharge port in the longitudinal direction is preferably larger than a diameter of the substrate. In this way, the processing fluid may be supplied as a uniform flow over the entire surface of the substrate. In particular, when an opening shape and an opening size of the discharge port are made identical to a shape and a size of a cross section of the output flow path, the flow of the processing fluid supplied from the output flow path to the processing space through the discharge port may be without turbulence.

Further, for example, it may be configured that the chamber housing has a first member, a second member, and a third member, that the first member and the second member are combined in a vertical direction to form the processing space therebetween, and that the third member is combined to a side of a combined body of the first member and the second member to form a flow path therebetween. In this way, the chamber housing is configured by combining a plurality of members, and the gaps between the members are used as the processing space and the flow path, whereby the flow path having the complicated shape as described above may be realized.

In this case, for example, it may be configured that an upper surface of the second member is provided with a contact surface which contacts a lower surface of the first member and a concave part and a step part which are recessed lower than the contact surface, that the step part is adjacent to the concave part and has an upper surface located above an upper surface of the concave part, and that a part of the lower surface of the first member that faces the step part forms an upper surface of the output flow path. According to such a configuration, since the structure of the upper surface of the second member defines the shapes of the processing space and the output flow path, the lower surface of the first member may be flat, and the flow path that has a relatively simple structure may be realized.

Further, for example, it may be configured that a support tray which supports the substrate in a horizontal posture and which is capable of being housed in the processing space is further provided, that a recess larger than a planar size of the substrate is formed on an upper surface of the support tray, and that the substrate is capable of being housed in the recess. According to such a configuration, for example, by aligning the positional relationship between the upper surface of the support tray and the upper surface of the substrate, the turbulence of the flow of the processing fluid may be suppressed.

In this case, a depth of an upper surface of the concave part viewed from the contact surface may be larger than a thickness of the support tray in a vertical direction. According to such a configuration, the support tray that supports the substrate may be reliably housed in the processing space formed by the first member and the second member that face each other while surrounding the concave part.

Further, for example, it may be configured that in the bent parts, the flow direction changes by 90 degrees or more. According to such a configuration, by making a particularly large pressure loss occur in the bent parts, vaporization is likely to occur, while the pressure fluctuation on the upstream side may be suppressed from being propagated to the downstream side.

Further, it may be configured that the flow path includes an input flow path which opens toward the buffer space and allows the processing fluid to flow into the buffer space, and that the flow direction of the processing fluid changes between the input flow path and the buffer space. According to such a configuration, since the flow direction of the processing fluid changes at the connection part between the input flow path and the buffer space, the vaporization and expansion of the processing fluid may occur in the buffer space.

Further, for example, it may be configured that the substrate is supported in a horizontal posture in the processing space, and that the flow path opens on a side of the substrate toward the processing space. According to such a configuration, since the processing fluid sent from the flow path into the processing space smoothly flows along the substrate surface, the substrate surface may be uniformly and well processed.

In particular, the flow direction of the processing fluid flowing from the flow path into the processing space may be a horizontal direction. According to such a configuration, since the processing fluid is supplied in the horizontal direction along the surface of the substrate in the horizontal posture, a turbulent flow may be suppressed from occurring in the flow of the processing fluid from the flow path to the processing space. Therefore, the residues separated from the substrate may be prevented from redepositing on the substrate, and the substrate may be well processed.

Further, for example, the substrate processing apparatus according to the disclosure may further include a pipe which connects the fluid supply part and the chamber housing, and a valve which is inserted in the pipe and which controls a flow of the processing fluid in the pipe. According to such a configuration, the vaporization and expansion of the processing fluid caused by the fluctuation of the pressure loss due to the opening and closing of the valve occur before the processing fluid is supplied to the chamber housing. Therefore, the pressure fluctuation at this time is extremely unlikely to reach the processing space.

The disclosure may be applied to all substrate processing apparatuses that process a surface of a substrate with a processing fluid in a supercritical state. In particular, it may be applied to substrate drying processing for drying a substrate such as a semiconductor substrate with a supercritical fluid.

Although the disclosure has been described with reference to specific embodiments, this description is not meant to be construed in a limiting sense. Various modifications of the disclosed embodiment, as well as other embodiments of the present disclosure, will become apparent to persons skilled in the art upon reference to the description of the disclosure. It is therefore contemplated that the appended claims will cover any such modifications or embodiments as fall within the true scope of the disclosure.

What is claimed is:

1. A substrate processing apparatus, which processes a surface of a substrate with a processing fluid in a supercritical state, the substrate processing apparatus comprising:
    a chamber housing provided therein with a processing space capable of housing the substrate and a flow path which receives the processing fluid from outside and guides the processing fluid to the processing space; and
    a fluid supply part which pressure-feeds the processing fluid to the flow path,
    wherein a plurality of bent parts each of which changes a flow direction of the processing fluid are provided in the flow path, the plurality of bent parts includes a first bent part which changes the flow direction from a horizontal direction to a vertical direction and a second bent part which changes the flow direction from the vertical direction to the horizontal direction.

2. The substrate processing apparatus according to claim 1, wherein the flow path is provided with a buffer space in which a flow path cross-sectional area is increased when viewed from an upstream side in the flow direction and provided with at least one of the bent parts further on a downstream side in the flow direction than the buffer space,
    the flow path has an output flow path which connects the bent part which is most downstream in the flow direction to the processing space,
    the flow direction of the processing fluid changes between the buffer space and the output flow path, and
    the output flow path has a cross-sectional shape which is flat in a longitudinal direction being a direction parallel to the surface of the substrate and which is constant in the flow direction, and the output flow path is connected to the processing space through a discharge port which opens in a slit shape extending in the longitudinal direction and toward the processing space.

3. The substrate processing apparatus according to claim 2, wherein a size of an opening of the discharge port in the longitudinal direction is larger than a diameter of the substrate.

4. The substrate processing apparatus according to claim 2, wherein an opening shape and an opening size of the discharge port are identical to a shape and a size of a cross section of the output flow path.

5. The substrate processing apparatus according to claim 2, wherein the chamber housing has a first member, a second member, and a third member, and
    the first member and the second member are combined in the vertical direction to form the processing space therebetween, and the third member is combined to a side of a combined body of the first member and the second member to form the output flow path therebetween.

6. The substrate processing apparatus according to claim 2, wherein the flow path comprises an input flow path which opens toward the buffer space and allows the processing fluid to flow into the buffer space, and
    the flow direction of the processing fluid changes between the input flow path and the buffer space.

7. The substrate processing apparatus according to claim 1, further comprising:
    a support tray which supports the substrate in a horizontal posture and which is capable of being housed in the processing space,
    wherein a recess larger than a planar size of the substrate is formed on an upper surface of the support tray, and the substrate is capable of being housed in the recess.

8. The substrate processing apparatus according to claim 1, wherein the substrate is supported in a horizontal posture in the processing space, and the flow path opens on a side of the substrate toward the processing space.

9. The substrate processing apparatus according to claim 8, wherein the flow direction of the processing fluid flowing from the flow path into the processing space is a horizontal direction.

10. The substrate processing apparatus according to claim 1, further comprising:
    a pipe which connects the fluid supply part and the chamber housing; and
    a valve which is inserted in the pipe and which controls a flow of the processing fluid in the pipe.

11. A substrate processing apparatus, which processes a surface of a substrate with a processing fluid in a supercritical state, the substrate processing apparatus comprising:
    a chamber housing provided therein with a processing space capable of housing the substrate and a flow path which receives the processing fluid from outside and guides the processing fluid to the processing space; and
    a fluid supply part which pressure-feeds the processing fluid to the flow path,
    wherein a plurality of bent parts which change a flow direction of the processing fluid are provided in the flow path,
    wherein the flow path is provided with a buffer space in which a flow path cross-sectional area is increased when viewed from an upstream side in the flow direction and provided with at least one of the bent parts further on a downstream side in the flow direction than the buffer space,
    the flow path has an output flow path which connects the bent part which is most downstream in the flow direction to the processing space,
    the flow direction of the processing fluid changes between the buffer space and the output flow path, and
    the output flow path has a cross-sectional shape which is flat in a longitudinal direction being a direction parallel to the surface of the substrate and which is constant in the flow direction, and the output flow path is connected to the processing space through a discharge port which opens in a slit shape extending in the longitudinal direction and toward the processing space,
    wherein the chamber housing has a first member, a second member, and a third member, and
    the first member and the second member are combined in a vertical direction to form the processing space therebetween, and the third member is combined to a side of a combined body of the first member and the second member to form the output flow path therebetween,
    wherein an upper surface of the second member is provided with a contact surface which contacts a lower surface of the first member and a concave part and a step part which are recessed lower than the contact surface, the step part is adjacent to the concave part and has an upper surface located above an upper surface of the concave part, and a part of the lower surface of the first member that faces the step part forms an upper surface of the output flow path.

12. The substrate processing apparatus according to claim 11, further comprising a support tray which supports the substrate in a horizontal posture and which is capable of being housed in the processing space,
wherein a depth of an upper surface of the concave part viewed from the contact surface is larger than a thickness of the support tray in a vertical direction.

13. A substrate processing apparatus, which processes a surface of a substrate with a processing fluid in a supercritical state, the substrate processing apparatus comprising:
a chamber housing provided therein with a processing space capable of housing the substrate and a flow path which receives the processing fluid from outside and guides the processing fluid to the processing space; and
a fluid supply part which pressure-feeds the processing fluid to the flow path, wherein
a plurality of bent parts each of which changes a flow direction of the processing fluid by 90 degrees or more are provided in the flow path, thereby the flow path changes the flow direction by 90 degrees or more by a plurality of times before discharging the processing liquid into the processing space,
the flow path is provided with a buffer space in which a flow path cross-sectional area is increased when viewed from an upstream side in the flow direction and provided with at least one of the bent parts further on a downstream side in the flow direction than the buffer space,
the flow path has an output flow path which connects the bent part which is most downstream in the flow direction to the processing space,
the output flow path has a cross-sectional shape which is flat in a longitudinal direction being a direction parallel to the surface of the substrate and which is constant in the flow direction, and the output flow path is connected to the processing space through a discharge port which opens in a slit shape extending in the longitudinal direction and toward the processing space, and the flow path changes the flow direction by 90 degrees or more between the buffer space and the output flow path without changing a width of the flow path in the longitudinal direction.

14. The substrate processing apparatus according to claim 13, wherein a size of an opening of the discharge port in the longitudinal direction is larger than a diameter of the substrate.

15. The substrate processing apparatus according to claim 13, wherein an opening shape and an opening size of the discharge port are identical to a shape and a size of a cross section of the output flow path.

16. The substrate processing apparatus according to claim 13, wherein the chamber housing has a first member, a second member, and a third member, and
the first member and the second member are combined in a vertical direction to form the processing space therebetween, and the third member is combined to a side of a combined body of the first member and the second member to form the output flow path therebetween.

17. The substrate processing apparatus according to claim 13, further comprising:
a support tray which supports the substrate in a horizontal posture and which is capable of being housed in the processing space,
wherein a recess larger than a planar size of the substrate is formed on an upper surface of the support tray, and the substrate is capable of being housed in the recess.

18. The substrate processing apparatus according to claim 13, wherein the flow path comprises an input flow path which opens toward the buffer space and allows the processing fluid to flow into the buffer space, and
the flow direction of the processing fluid changes between the input flow path and the buffer space.

19. The substrate processing apparatus according to claim 13, wherein the substrate is supported in a horizontal posture in the processing space, and the flow path opens on a side of the substrate toward the processing space.

20. The substrate processing apparatus according to claim 19, wherein the flow direction of the processing fluid flowing from the flow path into the processing space is a horizontal direction.

* * * * *